United States Patent [19]

Uno et al.

[11] Patent Number: 4,770,986

[45] Date of Patent: Sep. 13, 1988

[54] PHOTOGRAPHIC SILVER HALIDE ELEMENT CONTAINING A CARBOXYLATED POLYETHYLENE LAYER

[75] Inventors: Akira Uno, Matsudo; Masashi Kubbota, Tokyo; Akira Ninohira, Funabashi; Toshihiko Ueoka; Masaoki Nozaki, both of Tokyo, all of Japan

[73] Assignee: Mitsubishi Paper Mills, Ltd., Tokyo, Japan

[21] Appl. No.: 876,044

[22] Filed: Jun. 19, 1986

Related U.S. Application Data

[63] Continuation-in-part of Ser. No. 809,177, Dec. 16, 1985, abandoned.

[30] Foreign Application Priority Data

| Dec. 24, 1984 | [JP] | Japan | 59-281391 |
| Jan. 14, 1985 | [JP] | Japan | 60-5393 |
| Feb. 22, 1985 | [JP] | Japan | 60-34882 |
| May 30, 1985 | [JP] | Japan | 60-118550 |

[51] Int. Cl.$^4$ .............................................. G03C 1/76
[52] U.S. Cl. ..................................... 430/523; 430/533; 430/534; 430/535; 430/538
[58] Field of Search ............... 430/523, 533, 534, 535, 430/538

[56] References Cited

U.S. PATENT DOCUMENTS

| 3,525,621 | 8/1970 | Miller | 430/533 |
| 3,615,561 | 10/1971 | Polce et al. | 430/534 |
| 3,630,742 | 12/1971 | Crawford et al. | 430/534 |
| 4,265,946 | 5/1981 | Yabe et al. | 430/533 |
| 4,293,642 | 10/1981 | Beavan et al. | 430/535 |
| 4,355,093 | 10/1982 | Trautiweiler | 430/534 |
| 4,429,039 | 1/1984 | Ochtai | 430/534 |

OTHER PUBLICATIONS

English Translation of Pertinent Portions of Japanese Patent Publication No. 89007/73.

*Primary Examiner*—Jack P. Brammer
*Attorney, Agent, or Firm*—Cushman, Darby Cushman

[57] ABSTRACT

Disclosed is a photographic material which comprises a synthetic plastic film, a polyolefin layer provided on one surface of the plastic film, an image forming layer provided on said polyolefin layer and layer (A) which contains at least one of carboxy-modified polyethylene, ethylene-ethyl acrylate copolymer, ethylene-vinyl acetate copolymer and polyolefin and which is provided on another surface of the synthetic plastic film opposite to the image forming layer side, the surface of said polyolefin layer which contacts with the image forming layer being a roughened surface and the surface of the layer (A) being a mirror-like surface.

8 Claims, No Drawings

PHOTOGRAPHIC SILVER HALIDE ELEMENT CONTAINING A CARBOXYLATED POLYETHYLENE LAYER

This application is a continuation-in-part of copending Ser. No. 809,177, filed Dec. 16, 1985, now abandoned.

BACKGROUND OF THE INVENTION

This invention relates to a photographic material, particularly to a photographic material which comprises a synthetic plastic film, a polyolefin (abbreviated as "PO" hereinafter) layer provided on one surface of the plastic film, an image forming layer provided on said PO layer and layer (A) which contains at least one of carboxy-modified polyethylene (abbreviated as "CPE" hereinafter), ethylene-ethyl acrylate copolymer (abbreviated as "EEA" hereinafter), ethylene-vinyl acetate copolymer (abbreviated as "EVA" hereinafter) and PO and which is provided on another surface of the synthetic plastic film opposite to the image forming layer side, the surface of said polyolefin layer which contacts with the image forming layer being a roughened surface and the surface of the layer (A) being a mirror-like surface.

As a support for photographic materials, for example, lithographic printing plates, there are used metallic plates such as aluminum plate, zinc plate, etc., plastic films, paper materials, among which suitable supports are chosen considering printing endurance and other printing characteristics such as ink stains formed while printing, adhesion strength between image forming layer and support, and besides production cost, handling properties.

Recently, automatic plate making and automatic printing systems have been remarkably spread in office light printings and lithographic printing plates excellent in printing endurance and suitable for various plate-making processes have been used.

Usually, plate-making from lithographic printing plate is carried out by giving imagewise exposure from the top side of the plate (i.e. image forming layer side with reference to the support) by a process camera having a reversing mirror (often referred to as "top face exposure method" hereinafter). In this case, the support of lithographic printing plates may not be transparent and various metallic plates and paper materials may also be used as the support. However, when the plate-making is carried out by giving an imagewise exposure from the back side of the photographic material for lithographic printing plates (i.e. the side opposite to the image forming layer) by a process camera with no reversing mirror (often referred to as "back face exposure method" hereinafter), the support is required to be transparent and so metallic plates and paper materials cannot be used as the support and plastic films high in transparency are used.

The photographic materials of this invention can be used not only for the ordinary lithographic printing plates of the top face exposure type, but also for especially the lithographic printing plates of back face exposure type. The so-called back face exposure method according to which an imagewise exposure is carried out from the back side of the photographic materials by a process camera containing no reversing mirror is disclosed, for example, in Japanese Patent Unexamined Publication (KOKAI) No. 89007/73.

Because of excellent transparency, plastic films are used for various photographic materials and are also suitable as the support of photographic materials for lithographic printing plates of back face exposure type.

For supports of photographic materials for lithographic printing plates which are strongly required to have characteristics such as elongation and stiffness, polyester films are suitable among various plastic films such as triacetate films, polycarbonate films, polystyrene films, polypropylene films, polyvinyl chloride films, polyester films and the like.

Photographic materials, especially those for lithographic printing plates are used under high printing pressures and in highly viscous state and hence the surface of support and image forming layer (which might be referred to as "an emulsion layer" hereinafter) must sufficiently adhere to each other. However, due to poor surface activity of polyester films per se, it is difficult to directly coat the emulsion on the surface of the films and besides, even when the emulsion is coated after surface activation treatment such as corona discharge treatment, significant problems such as peeling of emulsion layer (frilling) occur during a sequence of photographic treatments due to difference in heat shrinkage of polyester film and the emulsion layer.

Adhesion between the polyester film and the emulsion layer can be increased by providing on the polyester film a resin layer of other resins such as polyolefins which are thermoplastic resins.

SUMMARY OF THE INVENTION

One object of this invention is to provide a photographic material comprising a synthetic plastic film such as polyester film having a resin layer on both surfaces with sufficiently high adhesion strength between the film and the resin layer, for example, suitable for lithographic printing plates, especially for lithographic printing plate of back face exposure type.

DESCRIPTION OF THE INVENTION

Because of its excellent transparency, a plastic film provides a support suitable for the back face exposure. Examples of such plastic films are triacetate film, polycarbonate film, polystyrene film, polypropylene film, polyvinyl chloride film, and polyester film. For use as a support for photographic materials, especially for lithographic printing plates, the plastic films are required to have a certain degree of stiffness and nonextensibility. As the plastic film sufficiently conforming to the requirements, mention may be made of polyester film. Being low in surface affinity, however, the polyester film is difficult to coat directly with an emulsion. Even when an emulsion is coated on the polyester film which has been activated on the surface by corona treatment, an important disadvantage of the detachment (separation of emulsion layer) will be revealed during the sequence of photographic treatments because of the difference in thermal contraction between the film and the emulsion layer.

A strong adhesion between the polyester film and the emulsion layer can be attained without deterioration in the transparency by providing on the polyester film surface a layer of other resins such as, for example, a polyolefin resin layer.

The curling of a lithographic printing plate is a detestable defect, because it tends to cause troubles in the operation of automatic printing plate making and printing processes. Therefore, when a polyester film support is required to treat with a resin, the treatment is usually performed on both sides of the film.

From the viewpoint of transparency, it is desirable that the polyester film support for lithographic photographic materials of the back face exposure type be provided on both sides with a mirror-like surface polyolefin resin layer. However, such a material having a mirror-like surface on both sides tends to cause blocking (adhesion between one face and the reverse face) when made into a roll in a winding unit, thus making the material useless, but when back-coating is carried out in-line with extrusion coating of the resin layer, such material can be used. When a polyester film is provided on both sides with roughened surface polyolefin resin layers, the deterioration in the transparency and blur (unclear images and lines), etc, become so large that the material becomes unsuitable for the back face exposure.

The present inventors carried out an extensive study to overcome the above difficulties and, as a result, has accomplished the present invention.

According to this invention there is provided a photographic material especially suitable for making a lithographic printing plate, which comprises a synthetic plastic film, a PO layer provided on one surface of the plastic film, an image forming layer provided on said polyolefin layer and layer (A) which contains at least one of CPE, EEA, EVA and PO and which is provided on another surface of the synthetic plastic film opposite to the image forming layer side, the surface of said PO layer which contacts with the image forming layer being a roughened surface and the surface of the layer (A) being a mirror-like surface.

According to this invention there is obtained a satisfactory photographic material of the back face exposure type for making lithographic printing plate without any actual damage to the transparency and without causing formation of blur, because an emulsion layer is provided on a roughened surface resin layer. In order to counteract any curling tendency of the present photographic material, it is desirable to provide a backing layer comprising gelatin as major constituent on the mirror-like surface resin layer. The backing layer may contain a variety of inorganic pigments such as silica and talc insofar as the transparency necessary for the back face exposure is not injured.

Furthermore, the advantage of coating the emulsion on the roughened surface resin layer and backing layer on the mirror-like surface resin layer in this invention is improvement of travelling in the course of processing.

The advantage brought about by employing a roughened surface as the surface to be coated with an emulsion and a mirror-like surface as the surface of the resin layer on back side of the plastic film is improvement in traveling property during processing. That is, if the surface to be coated with an emulsion is a mirror-like surface of resin layer and the back surface is a roughened surface of a resin layer as in the conventional materials, ordinarily, the back side layer is firstly provided and then emulsion is coated on the mirror-like surface. Thus, when back coating is effected, the mirror-like layer is on underside and so the mirror-like surface contacts with the surface of guide roll to often produce scuff marks or to cause slippage from the guide roll traveling like fish-tail. On the other hand, according to this invention, since the surface to be coated with emulsion is a roughened surface of resin layer, no such problems occur and good traveling property can be obtained.

As the synthetic plastic films, mention may be made of, for example, those of triacetate, polycarbonate, polystyrene, polypropylene, polyvinyl chloride, polyester, etc., but polyester film is especially preferred in this invention.

As the polyester film in this invention, use may be made of the types undrawn and drawn mono- or bi-axially. In view of the nonextensibility, stiffness, and thermal stability, however, a polyester film of the biaxially drawn type is most suitable. The thickness of the film can be in the range of 75 to 350 $\mu$, but preferably 100 to 188 $\mu$ in view of performance and cost.

The polyolefin resins used according to this invention include homopolymers such as low-density polyethylene, medium-density polyethylene, high-density polyethylene, polypropylene, polybutene, and polypentene; copolymers of two or more olefins such as ethylene-propylene copolymers, linear low-density polyethylenes which are copolymers of ethylene and $\alpha$-olefin and mixtures of these polymers. The polyolefins having various densities and melt indices (sometimes referred to as MI) are used each alone or in combinations.

The carboxy-modified polyethylene used in this invention is a polyethylene containing

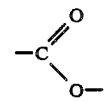

grouping in the molecule, such as, for example, a polyethylene modified by grafting thereon an unsaturated carboxylic acid. The unsaturated carboxylic acids include $\alpha,\beta$-unsaturated carboxylic acids such as maleic acid, acrylic acid, and methacrylic acid, and cycloaliphatic polybasic carboxylic acids having unsaturated bonds in the molecule. Anhydrides, amides, and esters of these acids are used in the grafting reaction. Various polyethylenes modified with various unsaturated carboxylic acids and having various densities and melt indices can be used each alone or in mixtures. Especially preferred is a carboxy-modified low-density polyethylene. A mixture of such a modified polyethylene with a suitable amount of polyolefins such as low-, medium-, or high-density polyethylene may also be used.

The ethyl acrylate content of the ethyleneethyl acrylate copolymer used in this invention is not subject to any special restriction but is generally 5 to 20%, preferably 7 to 18%. The copolymers having various densities and melt indices are used each alone or in mixtures. Other resins such as, polyolefins, for example, low-, medium-, and high-density polyethylenes can be admixed in suitable amounts insofar as the adhesiveness is not insured. When ethyl acrylate content is about 18%, amount of the copolymer is preferably less than 75% because blocking to cooling roll is too large and sometimes sticking to the roll occurs.

The ethylene-vinyl acetate copolymer used in this invention generally contains 6 to 40% by weight, preferably 6 to 28% by weight of vinyl acetate. Those of various densities and various melt viscosity indexes may be used singly or in combination. Furthermore, other resins such as low-density polyethylene, medium-density polyethylene and high-density polyethylene may be optionally added so long as the adhesion is not injured.

If necessary, carboxy-modified polyethylene, ethylene-ethyl acrylate copolymer and ethylene-vinyl acetate copolymer may be used in admixture. Furthermore, polyolefin may be added thereto.

Although not restricted to any specific value, the thickness of each layer provided on both sides of polyester film is generally 10 to 70 μ, preferably 20 to 40 μ.

The roughened surface resin layer according to this invention is formed by means of cooling roll commonly used in melt extrusion coating, which have been subjected to roughening finish on the surface. The allowable extent of roughening covers a wide range from a slight roughening sufficient for preventing the blocking between roughened surface resi layer and the mirror-like surface resin layer to an intense roughening so far as adverse effects are not exerted on the transparency, blurs (unclear images or lines) are not formed and the like when an emulsion layer is provided on the roughened surface resin layer and used in the back face exposure. The mirror-like surface resin layer is formed by means of cooling rolls similar to those described above, which have been subjected to mirror finish on the surface.

The backing layer according to this invention comprises gelatin as major constituent and may contain a hardener and inorganic pigments insofar as the transparency necessary for the back face exposure is not injured and blurs are not formed. The layer can contain other additives such as antistatics, surface active agent, and latices.

The inventors have further made intensive researches in an attempt to attain remarkable improvement of adhesion strength between, for example, a polyester (abbreviated to "PET" hereinafter) film and a PO layer on which an image forming layer is to be provided, from another viewpoint to find that sufficient result can be obtained when the surface of, for example, PET is allowed to have a contact angle of 42° to 55°, preferably, 42° to 50° by surface activation treatment such as corona discharge treatment.

Hitherto, it has been considered that the adhesion strength between paper and PO becomes higher with increasing the degree of, for example, corona discharge treatment of the paper. However, it has been found that a synthetic plastic film, for example, PET has an optimum corona discharge quantity (optimum contact angle). That is, there has been found the surprising fact that when an extremely strong corona discharge (less than 42° in terms of contact angle) is given, the adhesion strength rather decreases. Naturally, sufficient adhesion strength cannot be obtained if corona discharge treatment is not given or is small in degree.

Thus, this invention further relates to a photographic material comprising a synthetic plastic film and a PO layer provided on one surface of the film, wherein the surface of the synthetic plastic film on which the resin layer is to be provided has a contact angle of 42° to 55°, preferably 42° to 50°.

The contact angle in this invention is measured by droplet method with distilled water using the device for measurement of face contact angle (manufactured by Kyowa Kagaku Co.). That is, surface of a film is subjected to corona discharge treatment at various intensities by a corona discharge device provided in-line with an extrusion coater and thereafter the contact angle is measured by the device for measurement of face contact angle provided in a thermohygrostatic chamber (20° C.-65% RH).

In the photographic materials of this invention, there is provided a layer (layer (A)) containing at least one of CPE, EEA, EVA and PO on the surface of the synthetic plastic film which is opposite to the image forming layer side. In this case, when the layer (A) contains CPE, EEA or EVA, the adhesion to the film is improved. When the surface of the film, for example, PET film is subjected to an activation treatment (corona discharge treatment), the adhesion between the layer (A) and the film is further improved.

The image forming layer provided on a thermoplastic resin layer of the photographic materials according to this invention is generally a silver halide emulsion layer or an image receiving layer having a physical development nuclei layer for silver complex diffusion transfer process and these photographic materials may be used as various photographic materials. However, the photographic materials of this invention are especially suitable as light-sensitive materials for printing such as lithographic printing plates because of the markedly high adhesion between the polyester film and the thermoplastic resin. In addition, the photographic materials of this invention can be used for those according to silver-dye-bleach method which requires high adhesion. Furthermore, the photographic materials of this invention wherein the polyester film and/or the resin layer are rendered translucent or opaque by inclusion therein of titanium dioxide, etc. can also be used for photographic films or print films (which are display materials for advertizement employed at stations, etc. which contain an illumination lamp on the back side, namely, the side opposite to a viewer.).

EXAMPLE 1

A low-density polyethylene, 0.92 in density and MI 5, was melt extruded at 350° C. from the die of a melt extruder and coated on a polyester film, 188μ in thickness, while the film having been corona-treated. The thickness of the polyethylene coating layer was adjusted to 40μ by means of cooling roll which had been roughened on the surface and the resulting roughened surface of the polyethylene coating layer was corona-treated. Another surface of the above polyester film was similarly coated with the low-density polyethylene by melt extrusion coating, while the film surface having been corona-treated. The thickness of the coating layers was adjusted to 40μ by means of cooling roll with mirror surface finish. The resulting lithographic printing plate support was designated as sample A.

For comparison, the above procedure was repeated, except that the mirror-like surface resin layer was corona-treated on the surface (sample B).

The roughened surface resin layer of sample A was coated with about 6 g/m² (dry basis) of a lithographic emulsion layer and dried. The lithographic emulsion layer comprised the following first layer and second layer coated thereon.

| The first layer | |
|---|---|
| Chlorobromide emulsion (orthochromatic) | 300 g |
| Silver bromide | 20 mol % |
| Silver chloride | 80 mol % |
| Average grain size | 0.4μ |
| Binder content | 20 g |
| Silver content | 0.1 mol |
| Silica (average particle size 5μ) | 3 g |
| Formalin (12% aqueous solution) | 3 cc |
| Saponin (10% aqueous solution) | 10 cc |
| Water to make up | 400 g |

The second layer (physical development nuclei hydrosol liquid obtained by mixing the following liquids I and II).

| Liquid I | |
| --- | --- |
| Palladium chloride | 1 g |
| Hydrochloric acid | 20 cc |
| Water | 250 cc |
| Liquid II | |
| Sodium thiosulfate | 4 g |
| 10% Aqueous saponin solution | 10 cc |
| Water | 1000 cc |

The back side (opposite to the emulsion side) of Sample A was imagewise exposed by a process camera having no reversal mirror. Subsequently, the exposed Sample A was subjected to silver complex diffusion transfer development and acidic neutralization treatment to obtain a lithographic printing plate. The surface of Sample A was inspected with a magnifying glass to find no blur. The resulting printing plate was mounted on an offset printing press and the press was run. Printed copies with no blurred image areas were obtained after five thousands copies had been printed.

Another lithographic printing plate was prepared from sample B (emulsion layer was disposed on a mirror-like surface resin layer; resin layer on the reverse side had roughened surface) by the same procedure as described above. The printing plate, which showed indistinct image areas upon inspection with a magnifying glass, was mounted on an offset printing press and the press was run. Printed copies with only blurred image were obtained.

EXAMPLE 2

A low-density polyethylene, 0.92 in density and MI 7, was melt extruded at 335° C. from the die of a melt extruder and coated on a polyester film, 175μ in thickness, while the film surface having been corona-treated. The thickness of the polyethylene coating layer was adjusted to 30μ by means of cooling roll which had been roughened on the surface. The resulting roughened surface of the polyethylene coating layer was corona-treated. Another surface of the above polyester film was similarly coated with a resin composition comprising 50 parts by weight of a low-density polyethylene, 0.92 in density and MI 7, and 50 parts by weight of a high-density polyethylene, 0.96 in density and MI 7, by melt extrusion coating at 335° C., while the film surface having been corona-treated. The thickness of the coating layer was adjusted to 20μ by means of cooling roll with mirror-finished surface.

In the same manner as in Example 1, the roughened surface resin layer of the lithographic printing plate support obtained above was coated with a lithographic emulsion layer, then exposed, and subjected to photographic processing to prepare a lithographic printing plate. The printing test was performed in the same manner as in Example 1. There were obtained printed copies of good quality with no blurred image areas after five thousands copies had been printed.

EXAMPLE 3

A medium-density polyethylene, 0.93 in density and MI 7, was melt extruded at 350° C. from the die of a melt extruder and coated on one surface of a polyester film, 100μ in thickness, while the film surface having been corona-treated. The thickness of the polyethylene coating layer was adjusted to 30 μ by means of cooling roll which had been roughened on the surface. Another surface of the above polyester film was similarly coated with the same polyethylene, while the film surface having been corona-treated. The thickness of the coating layer was adjusted to 30μ by means of cooling roll with mirror-finished surface. Both the roughened surface resin layer and the mirror-lik surface resin layer were corona-treated on the surface. The mirror-like surface resin layer of the resulting lithographic printing plate support was coated with about 4 g/m² (dry basis) of a backing composition comprising gelatin and a small amount of a hardener. The preparation of lithographic printing plate and the printing test were carried out as in Example 1. Similarly to Example 1, both the printing plate and the printed copies showed no blurred image areas after five thousands copies had been printed.

EXAMPLE 4

In a manner similar to that in Example 1, a low-density polyethylene, 0.92 in density and MI 9, was extrusion-coated on both surfaces of polyester film of 100μ in thickness. Each polyethylene layer was 30μ in thickness. Both the resulting roughened surface and mirror-like surface resin layers were corona-treated. The mirror-like surface resin layer was coated with about 5 g/m² (dry basis) of a backing composition comprising gelatin, a small amount of a hardener, and some amount of silica. The preparation of lithographic printing plate and the printing test were carried out as in Example 1. Similarly to Example 1, both the printing plate and the printed copies showed no blurred image areas after five thousands copies had been printed.

EXAMPLES 5-9

On one surface of polyester films having a thickness of 100μ (Examples 5-9) while the surface having been subjected to corona discharge treatment so that the surface had a contact angle as shown in Table 1 was extrusion coated each of the resins as shown in Table 1 by extrusion from a melt extruder at 320° C. and adjusting the thickness to that as shown in Table 1 by a cooling roll with roughened surface finish. The surface of the roughened surface resin layer was also subjected to corona discharge treatment of a specific intensity. Subsequently, another surface of the polyester films while having been subjected to corona discharge treatment of a specific intensity was coated with the same resins as used for the top surface layer by the extrusion coating at the same thickness as that of the top surface layer using a cooling roll with a mirror-like surface finish.

The roughened surface resin layer of Examples 5-9 thus obtained was coated with an emulsion for lithographic printing plate (about 6 g/m² as solid content) of Example 1, then dried and thereafter was imagewise exposed from the side opposite to the emulsion layer and subjected to a series of photographic treatments to obtain lithographic printing plates.

The surface of these lithographic printing plates was inspected with a magnifying glass to find no blur. Furthermore, these lithographic printing plates were mounted on an offset printing press and printing was carried out to obtain printed copies of excellent finish with no blur. However, from those which had a contact anble of 40°, 60° at polyester film surface were obtained about 5,000 copies while from those where the contact angle was 55° were obtained more than 10,000 copies and especially when the contact angle was 42°, 50°, more than 20,000 clear copies were obtained.

problems was the same as those of the corresponding example.

TABLE 1

| EXAMPLES | Kind of resins | Density | MI | Amount of resin % | Kind of resins | Density | MI | Amount of resin % | Thickness of resin layer μ | Contact angle θ | Number of printed copies with no problems |
| --- | --- | --- | --- | --- | --- | --- | --- | --- | --- | --- | --- |
| 5 | Low-density polyethylene | 0.92 | 5 | 100 | | | | | 30 | 40 | about 5,000 |
| 6 | | | | | | | | | " | 42 | more than 20,000 |
| 7 | | | | | | | | | " | 50 | " |
| 8 | | | | | | | | | " | 55 | more than 10,000 |
| 9 | | | | | | | | | " | 60 | about 5,000 |

EXAMPLE 10

Sample was made in the same manner as in Example 6 except that after subjecting the mirror-like surface resin layer on the back side of the polyester film to corona discharge treatment of a specific intensity, a back coat layer (about 5 g/m² as solid content) comprising gelatin, a small amount of a hardener and some amount of silica was privided on the mirror-like surface. From this sample, lithographic printing plate was made in the same manner as in Examples 5-9 and was subjected to the printing tests in the same manner as in Examples 5-9. The printed copies showed no blur and had good quality and the number of the printed copies obtained with no problems was the same as those of the corresponding example.

EXAMPLE 11

Sample was made in the same manner as in Example 7 except that the roughened surface resin layer on the top side of the polyester film was replaced by the mirror-like surface resin layer and the mirror-like surface resin layer on the back side was replaced by a roughened surface resin layer (thickness of the polyester film was 170μ and that of the resin layer on both sides was 30μ for all samples). From this sample, lithographic printing plates were made in the same manner as in Example 7 except that the exposure was given from the emulsion layer side (i.e., top surface exposure) and the printing tests were carried out on these printing plates. The printed copies showed no blur and had good finish and the number of the printed copies obtained with no problems was the same as those of the corresponding example.

What is claimed is:

1. A photographic element which comprises a synthetic plastic film, a polyolefin layer provided on a first surface of the plastic film, said plastic film first surface having a contact angle of 42° to 55°, an image forming layer including a silver halide emulsion layer, provided on said polyolefin layer and layer (A) which consists essentially of carboxylated polyethylene, and which is provided on a second surface of the synthetic plastic film opposite to said first surface, said plastic film second surface having a contct angle of 42° to 55°, the surface of said polyolefin layer which contact with the image forming layer being a roughened surface and the surface of the layer (A) being a mirror-like surface.

2. A photographic element according to claim 1 wherein the polyolefin is a polyethylene.

3. A photographic element according to claim 1 wherein the synthetic plastic film is a polyester film.

4. A photographic element according to claim 1 wherein the contact angle is 42° to 50°.

5. A photographic element according to claim 1 wherein a back coat layer is provided on the layer (A).

6. A photographic element according to claim 1 wherein the polyolefin layer and/or the layer (A) and/or the synthetic plastic film are translucent or opaque.

7. A photographic element according to claim 1 wherein the image forming layer is a silver halide emulsion layer.

8. A photographic element according to claim 1 wherein the image forming layer comprises a silver halide emulsion layer and a physical development nuclei-containing image receiving layer for diffusion transfer process.

* * * * *